(12) United States Patent
Stanton

(10) Patent No.: US 7,718,533 B2
(45) Date of Patent: May 18, 2010

(54) INVERTED VARIABLE RESISTANCE MEMORY CELL AND METHOD OF MAKING THE SAME

(75) Inventor: William Arthur Stanton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 165 days.

(21) Appl. No.: 11/797,872

(22) Filed: May 8, 2007

(65) Prior Publication Data

US 2008/0277641 A1    Nov. 13, 2008

(51) Int. Cl.
*H01L 21/302* (2006.01)

(52) U.S. Cl. .................. 438/689; 257/4; 257/E21.09

(58) Field of Classification Search .................. 438/689; 257/4, E21.09
See application file for complete search history.

(56) References Cited

U.S. PATENT DOCUMENTS

| | | | |
|---|---|---|---|
| 5,541,869 A | 7/1996 | Rose et al. | |
| 6,072,716 A | 6/2000 | Jacobson et al. | |
| 6,348,365 B1 | 2/2002 | Moore et al. | |
| 6,473,332 B1 | 10/2002 | Ignatiev et al. | |
| 6,724,425 B1 | 4/2004 | Moon et al. | |
| 6,881,623 B2 | 4/2005 | Campbell et al. | |
| 6,888,155 B2 | 5/2005 | Campbell | |
| 6,930,909 B2 | 8/2005 | Moore et al. | |
| 6,982,450 B2 | 1/2006 | Mattson | |
| 7,038,286 B2 | 5/2006 | Nejad et al. | |
| 7,064,970 B2 | 6/2006 | Nazarian | |
| 7,072,209 B2 | 7/2006 | Deak | |
| 7,149,100 B2 | 12/2006 | Nazarian | |
| 7,189,583 B2 | 3/2007 | Drewes | |
| 7,196,882 B2 | 3/2007 | Deak | |
| 7,200,035 B2 | 4/2007 | Zhu | |
| 2003/0054629 A1* | 3/2003 | Kawai et al. ................. 438/622 |
| 2004/0195604 A1 | 10/2004 | Hwang et al. | |
| 2004/0202016 A1 | 10/2004 | Campbell | |
| 2004/0238918 A1 | 12/2004 | Moore et al. | |
| 2006/0081898 A1 | 4/2006 | Wang et al. | |
| 2006/0094154 A1* | 5/2006 | Lung .......................... 438/102 |
| 2006/0099822 A1 | 5/2006 | Harshfield et al. | |
| 2006/0158547 A1 | 7/2006 | Komatsu et al. | |
| 2006/0169878 A1 | 8/2006 | Kasano et al. | |
| 2006/0211165 A1* | 9/2006 | Hwang et al. ................. 438/95 |
| 2007/0007443 A1 | 1/2007 | Takeuchi | |
| 2007/0040102 A1 | 2/2007 | Mouli | |
| 2007/0076486 A1* | 4/2007 | Jeong et al. ............ 365/185.22 |
| 2007/0188635 A1 | 8/2007 | Yamaguchi et al. | |
| 2007/0206241 A1 | 9/2007 | Smith et al. | |
| 2008/0049126 A1 | 2/2008 | Ford et al. | |

FOREIGN PATENT DOCUMENTS

| | | |
|---|---|---|
| EP | 1 376 594 A1 | 1/2004 |
| JP | 60-178404 | 9/1985 |

* cited by examiner

*Primary Examiner*—Thao X Le
*Assistant Examiner*—Matthew Gordon
(74) *Attorney, Agent, or Firm*—Dickstein Shapiro LLP

(57) ABSTRACT

An inverted variable resistance memory cell and a method of fabricating the same. The memory cell is fabricated by forming an opening in an insulating layer deposited over a semiconductor substrate, etching the top portion of the opening to have a substantially hemispherical-shape, forming a metal layer in the opening, and overlying a variable resistance material over the metal layer.

8 Claims, 8 Drawing Sheets

INVERTED VARIABLE RESISTANCE MEMORY CELL AND METHOD OF MAKING THE SAME

FIELD OF THE INVENTION

Disclosed embodiments relate generally to memory devices and methods for making memory devices and, particularly, to an inverted variable resistance memory cell and a method of making the same.

BACKGROUND OF THE INVENTION

Semiconductor memory devices are widely used in electronic systems and computers to store information in the form of binary data. These memory devices may be characterized as either volatile memory, where the stored data is lost if the power source is disconnected or removed or non-volatile, where the stored data is retained even during power interruption. Traditionally, however, non-volatile memory devices occupy a large amount of space and consume large quantities of power, making these devices unsuitable for use in portable devices or as substitutes for frequently-accessed volatile memory devices. On the other hand, volatile memory devices tend to provide greater storage capability and programming options than non-volatile memory devices. Volatile memory devices also generally consume less power than non-volatile devices.

An example of a non-volatile random access memory devices are variable resistance memory devices, which contain many types of resistance change materials, including magnetic materials, doped chalcogenide materials, phase change materials, among others.

One class of variable resistance change materials used in non-volatile random access memory devices are magnetic materials. These devices employ the magneto-resistive effect to store memory states and typically use the magnetization orientation of a layer of magneto-resistive material to represent and to store a binary state. For example, magnetization orientation in one direction may be defined as a logic "0", while magnetization orientation in another direction may be defined as a logic "1".

The ability to read stored binary states is a consequence of the magneto-resistive effect. This effect is characterized by a change in resistance of multiple layers of magneto-resistive material, depending on the relative magnetization orientations of the layers. Thus, a magneto-resistive memory cell typically has two magnetic layers that may change orientation with respect to one another. Where the directions of the magnetization vectors point in the same direction, the layers are said to be in a parallel orientation and where the magnetization vectors point in opposite directions, the layers are said to be oriented anti-parallel. In practice, typically one layer, the free or "soft" magnetic layer, is allowed to change orientation, while the other layer, the pinned or "hard" magnetic layer, has a fixed magnetization orientation to provide a reference for the orientation of the free magnetic layer. The magnetization orientation of the two layers may then be detected by determining the relative electrical resistance of the memory cell. If the magnetization orientation of its magnetic layers are substantially parallel, a memory cell is typically in a low resistance state. In contrast, if the magnetization orientation of its magnetic layers is substantially anti-parallel, the memory cell is typically in a high resistance state. Thus, ideally, in typical magneto-resistive memories, binary logic states are stored as binary magnetization orientations in magneto-resistive materials and are read as the binary resistance states of the magneto-resistive memory cells containing the magneto-resistive materials.

Giant magneto-resistive (GMR) and tunneling magneto-resistive (TMR) memory cells are two common types of memory cells that take advantage of this resistance behavior. In GMR cells, the flow of electrons through a conductor situated between a free magnetic layer and a pinned magnetic layer is made to vary, depending on the relative magnetization orientations of the magnetic layers on either side of the conductor. By switching the magnetization orientation of the free magnetic layer, the electron flow through the conductor is altered and the effective resistance of the conductor is changed.

In TMR cells, an electrical barrier layer, rather than a conductor, is situated between a free magnetic layer and a pinned magnetic layer. Electrical charges quantum mechanically tunnel through the barrier layer. Due to the spin dependent nature of the tunneling, the extent of electrical charges passing through the barrier vary with the relative magnetization orientations of the two magnetic layers on either side of the barrier. Thus, the measured resistance of the TMR cell may be switched by switching the magnetization orientation of the free magnetic layer.

Some examples of magneto-resistive memories are disclosed in U.S. Pat. Nos. 7,200,035; 7,196,882; 7,189,583; 7,072,209; 7,038,286; and 6,982,450, assigned to Micron Technology Inc. and incorporated herein by reference.

Another class of variable resistance change materials used in non-volatile random access memory devices are doped chalcogenide materials. Chalcogenides are alloys of Group VI elements of the periodic table, such as Te or Se. In such devices, a fast ion conductor such as a chalcogenide-metal ion and at least two electrodes (e.g., an anode and a cathode) having an electrically conducting material and disposed at the surface of the fast ion conductor are set a distance apart from each other. A specific example of a doped chalcogenide is germanium selenide with silver ions. Typically, to provide the silver ions within the germanium selenide material, germanium selenide is deposited onto the first electrode using chemical vapor deposition. A thin layer of silver is then deposited on the glass, for example by physical vapor deposition or another technique. The layer of silver is then irradiated with ultraviolet radiation. The thin nature of the deposited silver allows the energy to pass through the silver to the silver/glass interface to cause the silver to diffuse into the chalcogenide material. The applied energy and overlying silver result in the silver migrating into the glass layer such that a homogenous distribution of silver throughout the layer is ultimately achieved.

When a voltage is applied to the anode and the cathode, a non-volatile metal dendrite rapidly grows from the cathode along the surface of the fast ion conductor towards the anode. The growth rate of the dendrite is a function of the applied voltage and time; the growth of the dendrite may be stopped by removing the voltage or the dendrite may be retracted back towards the cathode, or even disintegrated, by reversing the voltage polarity at the anode and cathode. Changes in the length and width of the dendrite affect the resistance and capacitance of the variable resistance memory device.

Some examples of variable resistance memory devices and methods of manufacturing such devices are disclosed in U.S. Pat. Nos. 7,149,100; 7,064,970; 6,348,365; and 6,930,909, and U.S. Publication Nos. 2006/0099822; and 2004/0238918, assigned to Micron Technology Inc. and incorporated herein by reference. The memory cells manufactured using the methods disclosed in the above-mentioned publications result in a planar electrode at the top of a layer of chalcogenide material resulting in non-uniform electric field and subsequent signal integrity issues.

In yet another class of variable resistance change materials used in non-volatile random access memory devices are phase change materials. A specific chalcogenide currently used in rewriteable compact discs ("CD-RWs") is $Ge_2Sb_2Te_5$. In addition to having valuable optical properties that are utilized in CD-RW discs, $Ge_2Sb_2Te_5$ also has desirable physical properties as a variable resistance material. Various combinations of Ge, Sb and Te may be used as variable resistance materials and which are herein collectively referred to as GST materials. Specifically, GSTs can change structural phases between an amorphous phase and two crystalline phases. The resistance of the amorphous phase ("a-GST") and the resistances of the cubic and hexagonal crystalline phases ("c-GST" and "h-GST," respectively) can differ significantly. The resistance of amorphous GST is greater than the resistances of either cubic GST or hexagonal GST, whose resistances are similar to each other. Thus, in comparing the resistances of the various phases of GST, GST may be considered a two-state material (amorphous GST and crystalline GST), with each state having a different resistance that can be equated with a corresponding binary state. A variable resistance material such as GST whose resistance changes according to its material phase is referred to as a phase change material.

The transition from one GST phase to another occurs in response to temperature changes of the GST material. As shown in FIG. 1, the GST material has a melting temperature $T_m$ and a crystallization temperature $T_x$. The crystallization temperature $T_x$ is lower than the melting temperature $T_m$. Both the crystallization temperature $T_x$ and the melting temperature $T_m$ are higher than room temperature. Two curves are shown in FIG. 1, one curve for a-GST and the other for c-GST, h-GST. When the GST material is heated above the melting temperature $T_m$, the GST material loses its crystalline structure. If the GST material is then rapidly cooled to room temperature, the GST material is formed into an amorphous state—the cooling occurs too fast to allow a crystalline structure to grow. On the other hand, if the GST material is warmed to a temperature above the crystallization temperature $T_x$, but below the melting temperature $T_m$, a crystalline structure is able to grow. Once converted into a crystalline structure, the GST material remains in a crystalline structure until it is again heated above the melting temperature $T_m$. In other words, at room temperature, the GST material is stable in either the amorphous or crystalline phases.

In a phase change memory cell, the heating and cooling can occur by causing differing strengths of current to flow through the GST material. The GST material is placed in a crystalline state by passing a crystallizing current through the GST material, thus warming the GST material to a temperature wherein a crystalline structure may grow. A stronger melting current is used to melt the GST material for subsequent cooling to an amorphous state. As the typical phase change memory cell uses the crystalline state to represent one logic value, e.g., a binary "1," and the amorphous state to represent another logic value, e.g., a binary "0," the crystallizing current is referred to as a set current $I_{SET}$ and the melting current is referred to as an erase or reset current $I_{RST}$. One skilled in the art will understand, however, that the assignment of GST states to binary values may be switched if desired.

The state of the GST material is determined by applying a small read voltage $V_r$ across two electrodes and by measuring the resultant read current $I_r$. A lower read current $I_r$ corresponds to a higher resistance. Thus, a relatively low read current $I_r$ signifies that the GST material is in an amorphous state and a relatively high read current $I_r$ signifies that the GST material is in a crystalline state.

The phase-changing current is applied to the GST material via electrodes that bound a layer of the GST material. The present manufacturing process results in a planar electrode at the top of the GST layer. Because of the configurations of the bounding surface areas of the two electrodes and the GST layer, current densities within the GST material are not equally distributed.

Accordingly, there is a need for methods and structures where current densities and electric field may be uniformly distributed resulting in subsequent uniform signal integrity.

DETAILED DESCRIPTION OF THE INVENTION

Disclosed embodiments relate to an inverted variable resistance memory cell and a method of making the same.

The term "substrate" used in the following description may include any supporting structure including, but not limited to, a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit.

The term "variable resistance material" is intended to include—amorphous silicon doped with V, Co, Ni, Pd, Fe and Mn as disclosed in U.S. Pat. No. 5,541,869 to Rose et al.; perovskite materials such as $Pr_{(1-x)}Ca_xMnO_3$ (PCMO), $La_{(1-x)}Ca_xMnO_3$ (LCMO), $LaSrMnO_3$ (LSMO), $GdBaCo_xO_y$ (GBCO) as disclosed in U.S. Pat. No. 6,473,332 to Ignatiev et al.; doped chalcogenide glass of the formula $A_xB_y$, where "B" is selected from among S, Se and Te and mixtures thereof, and where "A" includes at least one element from Group III-B (B, Al, Ga, In, Tl), Group IV-B (C, Si, Ge, Sn, Pb), Group V-B (N, P, As, Sb, Bi), or Group VII-B (F, Cl, Br, I, At) of the periodic table, and with the dopant being selected from among the noble metals and transition metals, including Ag, Au, Pt, Cu, Cd, Ir, Ru, Co, Cr, Mn or Ni, as disclosed in U.S. Pat. Nos. 6,881,623 and 6,888,155 to Campbell et al. and Campbell, respectively; and a carbon-polymer film comprising carbon black particulates or graphite, for example, mixed into a plastic polymer, such as that disclosed in U.S. Pat. No. 6,072,716 to Jacobson et al.

The term "chalcogenide glass" is intended to include glasses that comprise an element from group VIA (or group 16) of the periodic table. Group VIA elements, also referred to as chalcogens, include sulfur (S), selenium (Se), tellurium (Te), polonium (Po), and oxygen (O).

The term "phase change material" is intended to include various phase-change materials, such as $Ge_2Sb_2Te_5$ (GST), GeSbTe, GeTe—$Sb_2Te_3$, and AgInSbTe.

Figure 1:
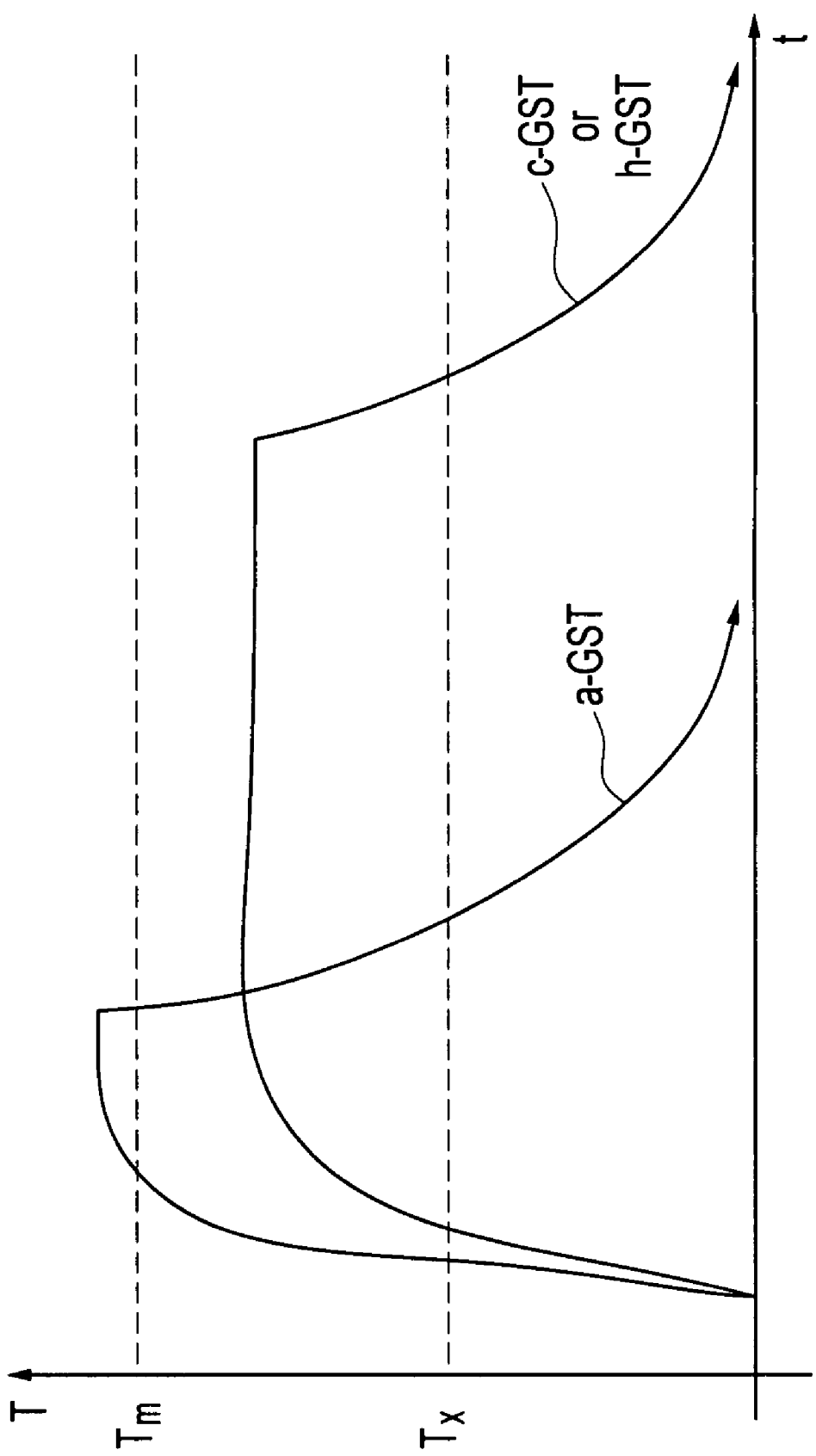
FIG. 1 illustrates the phase transitions for a GST material.
Figure 2:
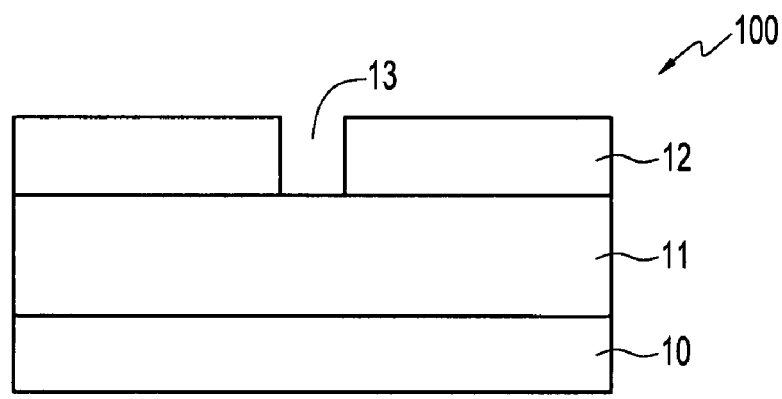
FIG. 2 is a cross-sectional view of a first embodiment described herein depicting a semiconductor substrate at an initial stage of processing.

Referring to FIG. 2, a phase change memory cell 100 at a first stage of fabrication is shown. A semiconductor substrate 10, such as a silicon wafer, preferably about 1000 Å to 3000 Å thick, includes transistors (not shown) for accessing the memory cell 100, the transistors having source/drain active regions in the substrate 10. A first insulating layer 11, for example, a boro-phospho-silicate glass (BPSG) layer, is formed over the substrate 10 and any transistor gatestacks (not shown) associated with the substrate 10. The first insulating layer 11 may be formed by any deposition method, such as, for example, sputtering, chemical vapor deposition (CVD), plasma enhanced CVD (PECVD), or physical vapor deposition (PVD). The first insulating layer 11 is preferably in the range of 3000 Å to 6000 Å thick.

The first insulating layer 11 may be formed of a conventional insulating nitride, oxide or any other insulating or dielectric material. The first insulating layer 11 may be, for example, silicon or silicon-based, such as silicon nitride. Conductive plugs (not shown), which may be formed of polysilicon, are formed in the first insulating layer 11 connecting to the transistor source drain regions in the substrate 10. A masking material 12 patterned to have necessary openings is formed over the first insulating layer 11.

Figure 3:
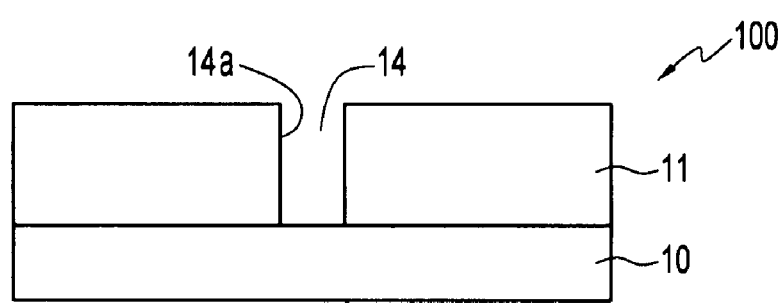
FIG. 3 is a cross-sectional view of the first embodiment during a stage of fabrication subsequent to that shown in FIG. 2.

Referring to FIG. 3, the first insulating layer 11 is etched to form a via 14. The etching is done using the masking material 12 (FIG. 2) and associated opening 13 (FIG. 2). The etching removes unmasked portions of the first insulating layer 11 to form the via 14 having substantially vertical sidewalls 14a.

Figure 4:
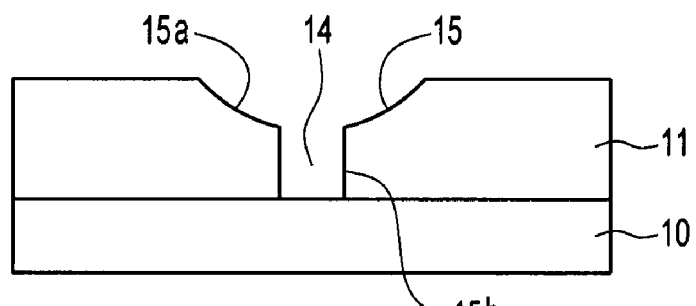
FIG. 4 is a cross-sectional view of the first embodiment during a stage of fabrication subsequent to that shown in FIG. 3.

A facet etch is then performed to smooth out the profile at the top portion of the via 14 to form a substantially uniform hemispherical top portion 15, as shown in FIG. 4. Subsequent to performing the facet etch, the bottom portion of the via 14 has substantially vertical sidewalls 15b and the top portion 15 of the via 14 has substantially uniform hemispherical-shaped sidewalls 15a. The distance between the vertical sidewalls 15b is preferably about 300 Å. The hemispherical-shaped sidewalls 15a of the top portion 15 have a radius, preferably, of about 1500 Å.

Figure 5:
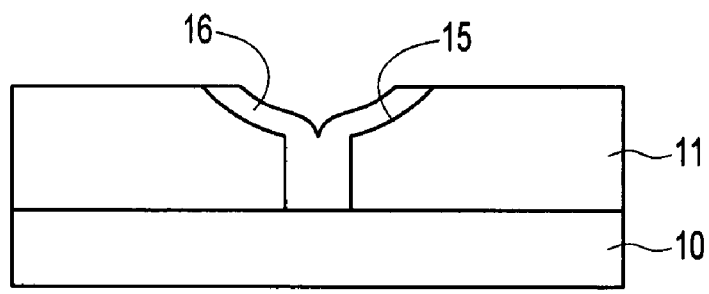
FIG. 5 is a cross-sectional view of the first embodiment during a stage of fabrication subsequent to that shown in FIG. 4.

Referring now to FIG. 5, portions of the via 14 are filled with a conductive material, such as, for example, tungsten, platinum, titanium nitride (TiN), tantunum nitride, or titanium aluminum nitride, to form a first conductive layer 16. The first conductive layer 16 has substantially uniform thickness, preferably 150 Å, along the sidewalls 15a (FIG. 4) of the top portion 15 and substantially completely fills the bottom portion of the via 14. The first conductive layer 16 is then planarized down to the top surface of the first insulating layer 11, by using an abrasive planarization etching technique, such as, for example, chemical mechanical planarization (CMP). The first conductive layer 16 acts as a first electrode for the memory cell 100.

Figure 6:
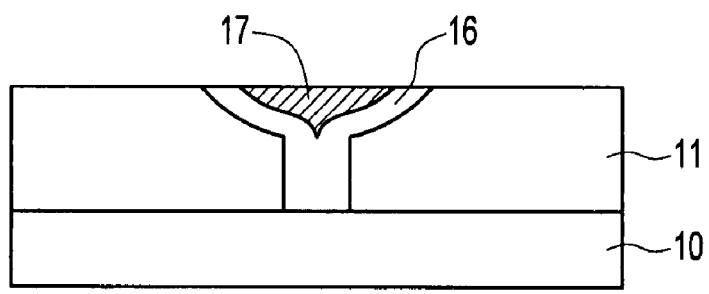
FIG. 6 is a cross-sectional view of the first embodiment during a stage of fabrication subsequent to that shown in FIG. 5.

Referring to FIG. 6, a phase change material is deposited onto the first conductive layer 16 to form a phase change material layer 17. The phase change material may be deposited by any deposition method, such as, for example, sputtering, chemical vapor deposition (CVD), plasma enhanced CVD (PECVD), or physical vapor deposition (PVD). The phase change material layer 17 is then planarized down to the top surface of the first insulating layer 11, by using an abrasive planarization etching technique, such as, for example, chemical mechanical planarization (CMP). Thus, the phase change material layer 17 is left only in the via 14 (FIG. 4).

In operation, the substantially hemispherical shape of the phase change material layer 17 will facilitate a uniform electrical field being applied to the phase change material. The more evenly distributed electric field results in a more evenly and completely transformed hemispherical amorphous region resulting in desirable signal integrity.

The phase change material layer 17 may also be formed of other variable resistance material or chalcogenide glass. The substantially uniform hemispherical-shaped phase change material layer 17 may facilitate a uniform electrical field being applied to the variable resistance material or chalcogenide glass.

Figure 7:
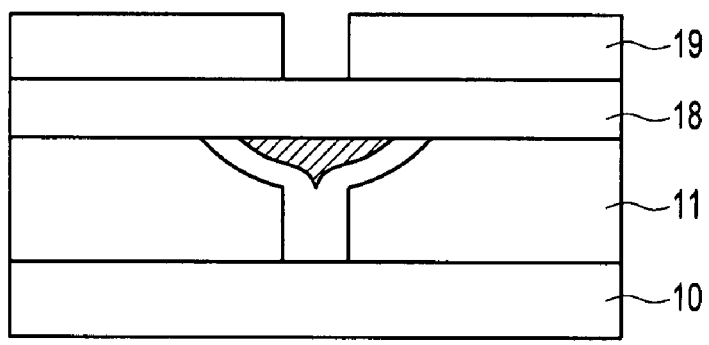
FIG. 7 is a cross-sectional view of the first embodiment during a stage of fabrication subsequent to that shown in FIG. 6.
Figure 8:
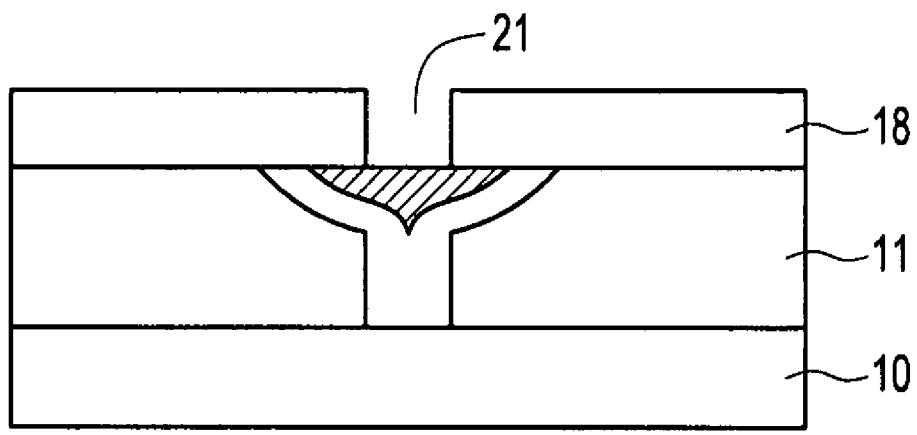
FIG. 8 is a cross-sectional view of the first embodiment during a stage of fabrication subsequent to that shown in FIG. 7.

Referring to FIGS. 7-8, a second insulating layer 18 is formed over the phase change material layer 17, the first conductive layer 16, and the first insulating layer 11. The second insulating layer 18 may be formed of boro-phospho-silicate glass (BPSG), a conventional insulating nitride, oxide or any other insulating or dielectric materials. The second insulating layer 18 may be formed by any deposition method, such as, for example, sputtering, chemical vapor deposition (CVD), plasma enhanced CVD (PECVD), or physical vapor deposition (PVD). The second insulating layer 18 is in the range of 100 Å to 5000 Å thick.

A masking material layer 19 is formed over the second insulating layer 18. The masking material layer 19 is patterned with openings in appropriate locations. The second insulating layer 18 is etched to form a via 21 (FIG. 8) using the masking material layer 19 (FIG. 7). The etching removes unmasked portions of the second insulating layer 18 to form the via 21 (FIG. 8).

Figure 9:
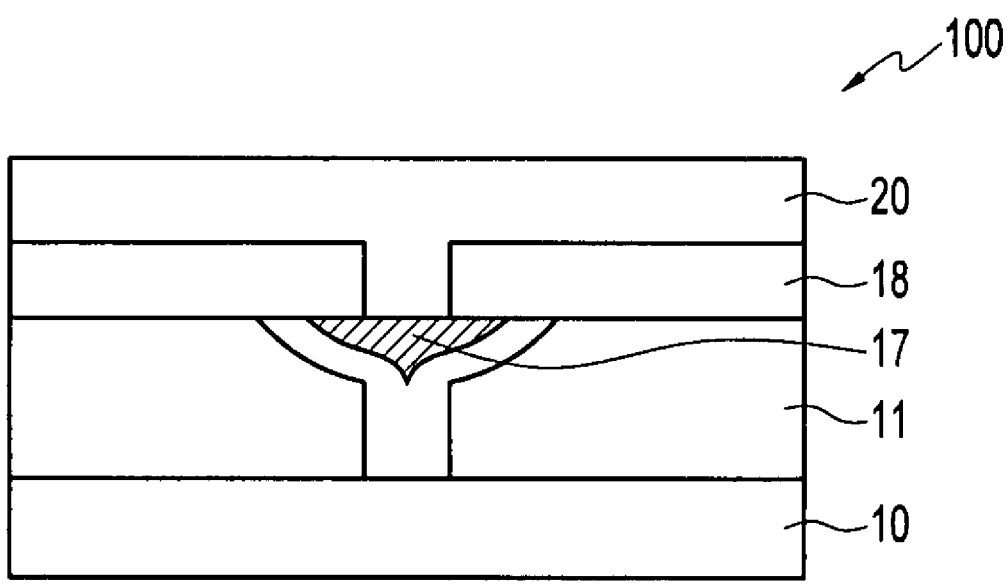
FIG. 9 is a cross-sectional view of the first embodiment during a stage of fabrication subsequent to that shown in FIG. 8.

Referring to FIG. 9, a second conductive layer 20 is formed over the second insulating layer 18, substantially filling the via 21 (FIG. 8). The second conductive layer 20 may be formed of material such as, for example, titanium nitride (TiN) or silver. The second conductive layer 20 acts as a second electrode for the memory cell 100. The second conductive layer 20 is in the range of 300 Å to 2000 Å thick.

The inverted phase change memory cell 100, fabricated as illustrated in FIGS. 2-9, results in a uniform electric field in the phase change material layer 17. A further advantage of the fabrication process is the minimal damage to the phase change material layer 17 from any potential reactive ion etching (RIE) and thereby, preventing formation of any non-uniform surface on the phase change material layer 17 resulting in a uniform electric field.

Figure 10:
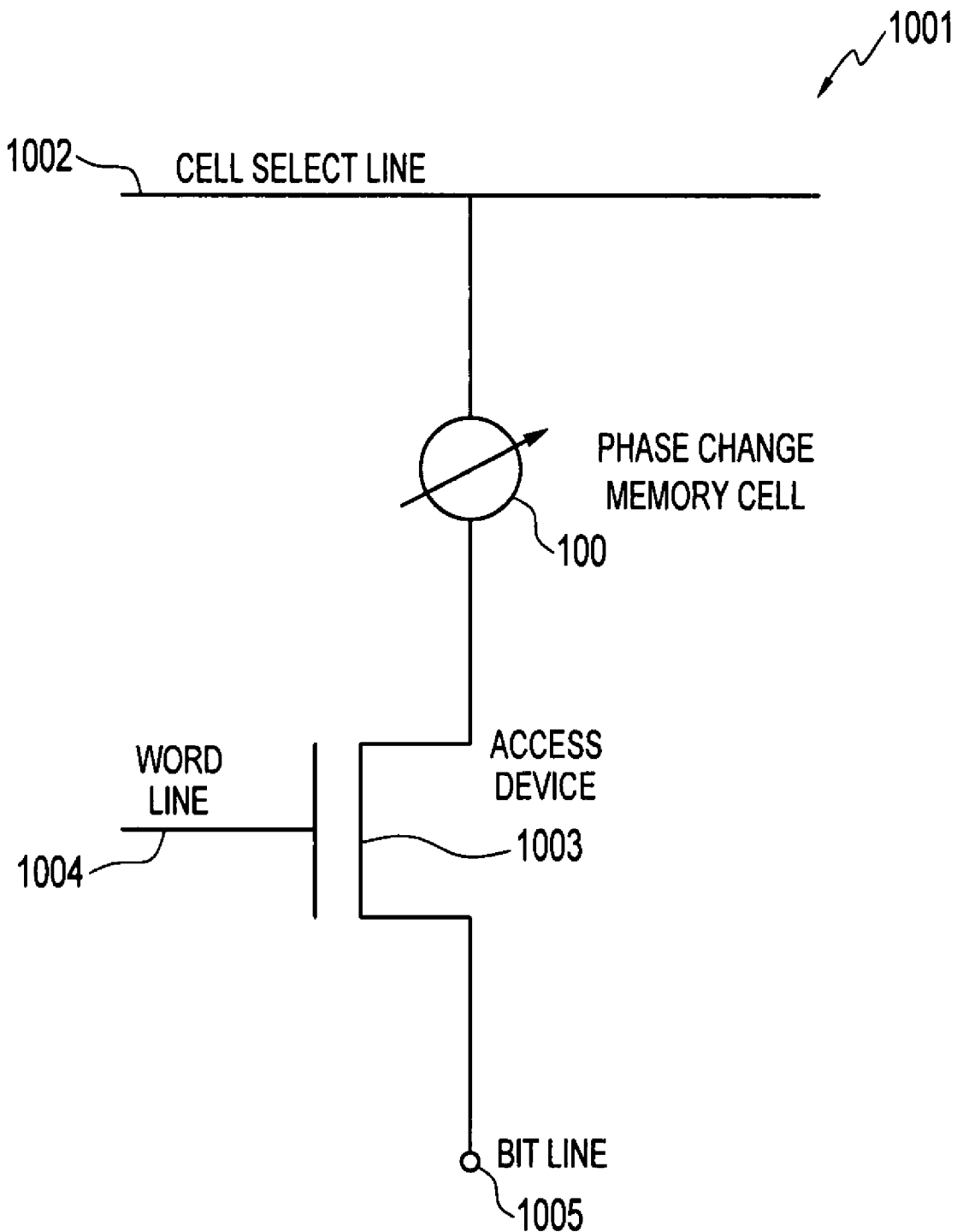
FIG. 10 illustrates a phase change memory bit structure containing embodiments described herein.

The phase change memory cell 100 may be arranged into a memory bit structure 1001, illustrated in FIG. 10. The memory cell 100 is connected to a cell select line 1002 via the cell's first or second electrode. The opposing electrode is connected to a source/drain terminal of an access device 1003 such as an access transistor. The access device 1003 is gated by a word line 1004. A bit line 1005 provides a source to the access device 1003 and is connected to the memory cell 100 when the access device 1003 is activated by a signal on the word line 1004.

Figure 11:
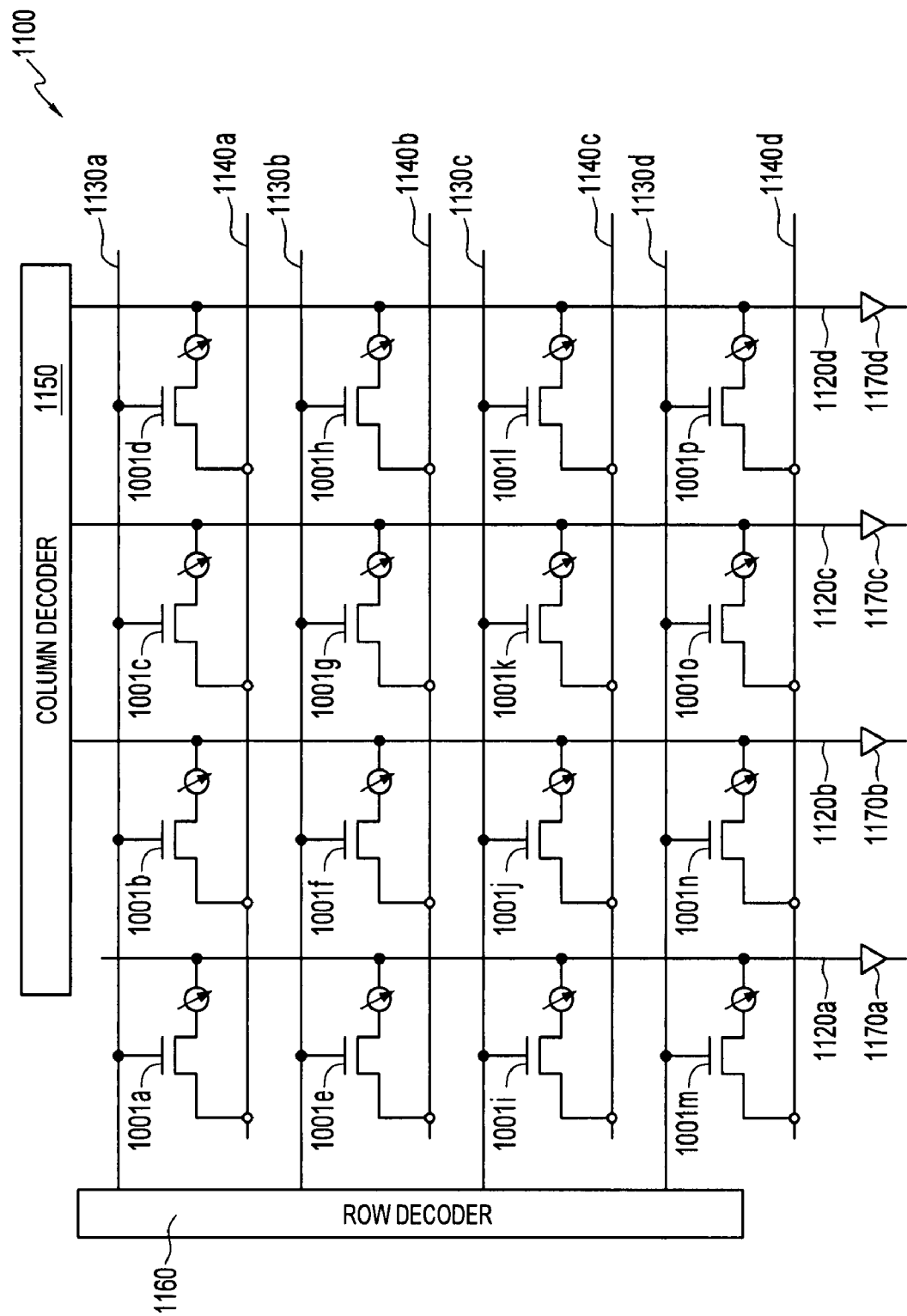
FIG. 11 illustrates an array of phase change memory bit structures containing embodiments described herein.

The memory bit structures 1001 of FIG. 10 may be arranged in an array of memory bit structures, as illustrated in FIG. 11. In FIG. 11, a memory device 1100 includes an array of memory bit structures 1001a-1001p. The memory bit structures 1001a-1001p are arranged in rows and columns. The rows and columns may be partially staggered or may be aligned as a simple parallel grid as in FIG. 11. The memory bit structures 1001a-1001p along any given cell select line 1120a-1120d do not share a common word line 1130a-1130d. Additionally, the memory bit structures 1001a-1001p along any given cell select line 1120a-1120d do not share a common bit line 1140a-1140d. In this manner, each memory bit structure is uniquely identified by the combined selection of the word line to which the gate of the memory cell access device is connected, and the cell select line to which the memory cell is connected.

Each word line 1130a-1130d is connected to a word line driver in the form of a row decoder 1160 for selecting the respective word line for an access operation. Similarly, each cell select line 1120a-1120d is coupled to a driver in the form of a column decoder 1150. The current passing through a selected memory bit structure 1001a-1001p is measured by sense amplifiers 1170a, 1170d connected respectively to the cell select lines 1120a-1120d.

For simplicity, FIG. 11 illustrates a memory array having only four rows of memory bit structures 1001 on four cell select lines 1120a-1120d and four columns of memory bit structures 1001 on four word lines 1130a-1130d. However, it should be understood that in practical applications, the memory device 1100 has significantly more memory bit structures in an array. For example, an actual memory device may include several million memory bit structures 1001 arranged in a number of subarrays.

Although illustrated as a single memory device 1100 in FIG. 11, the memory device 1100 may be fabricated as part of a memory array and operated with memory element access circuits, the access circuitry including copper bond pads having nickel caps.

Figure 12:
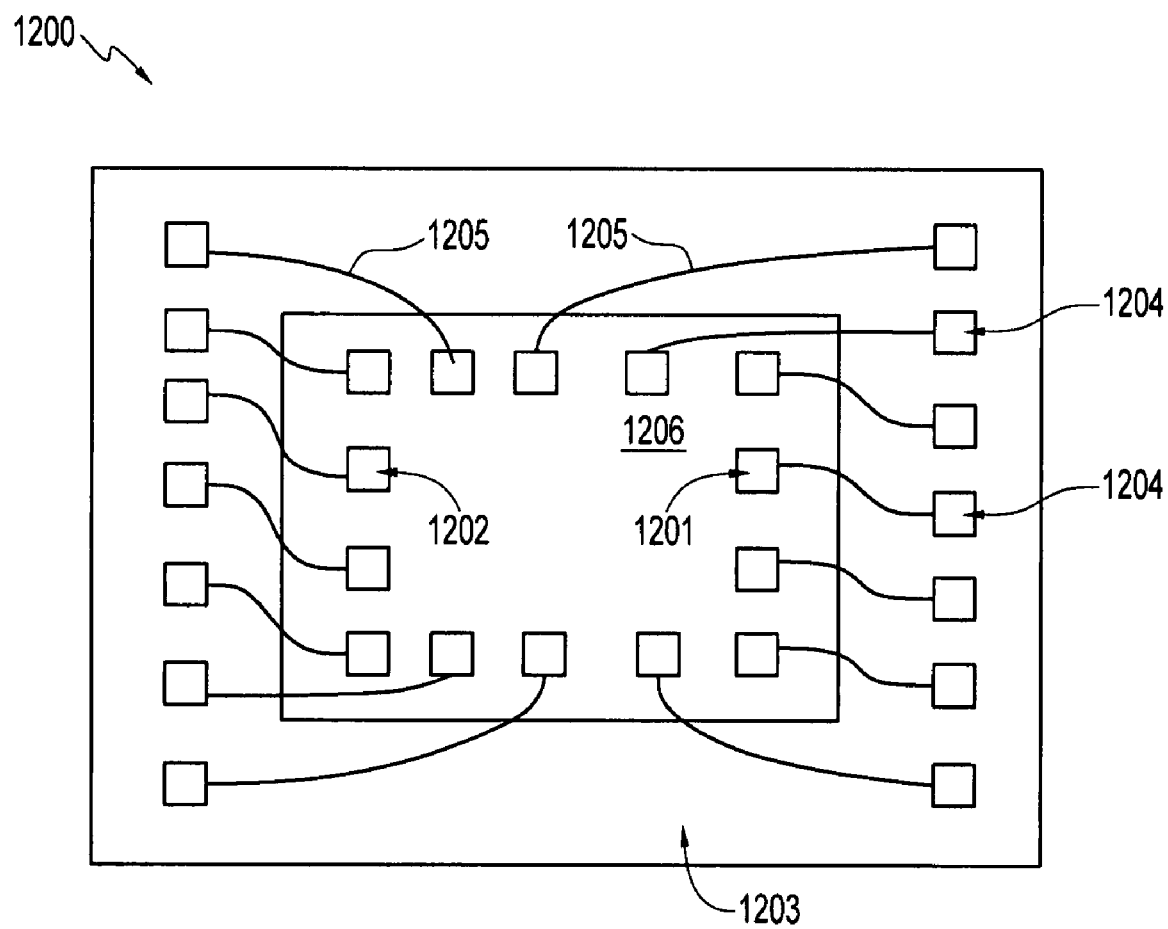
FIG. 12 illustrates an integrated circuit package containing embodiments described herein.

FIG. 12 illustrates that the memory device 1100 (FIG. 11) may be used in an integrated circuit memory package 1200. The memory device 1100 (FIG. 11) is physically mounted on a mounting substrate 1203 using a suitable attachment material. Bond wires 1205 are used to provide electrical connection between the integrated chip bond pads 1201, 1202 and the mounting substrate bond pads 1204 and/or lead wires which connect the die 1206 to peripheral circuitry (not shown) external of package 1200. The peripheral circuitry may include circuitry for addressing the memory device 1100 (FIG. 11), along with circuitry for storing data in and retrieving data from the memory device 1100 (FIG. 11). The peripheral circuitry may also include other circuitry used for controlling or otherwise insuring the proper functioning of the memory device 1100 (FIG. 11).

Figure 13:
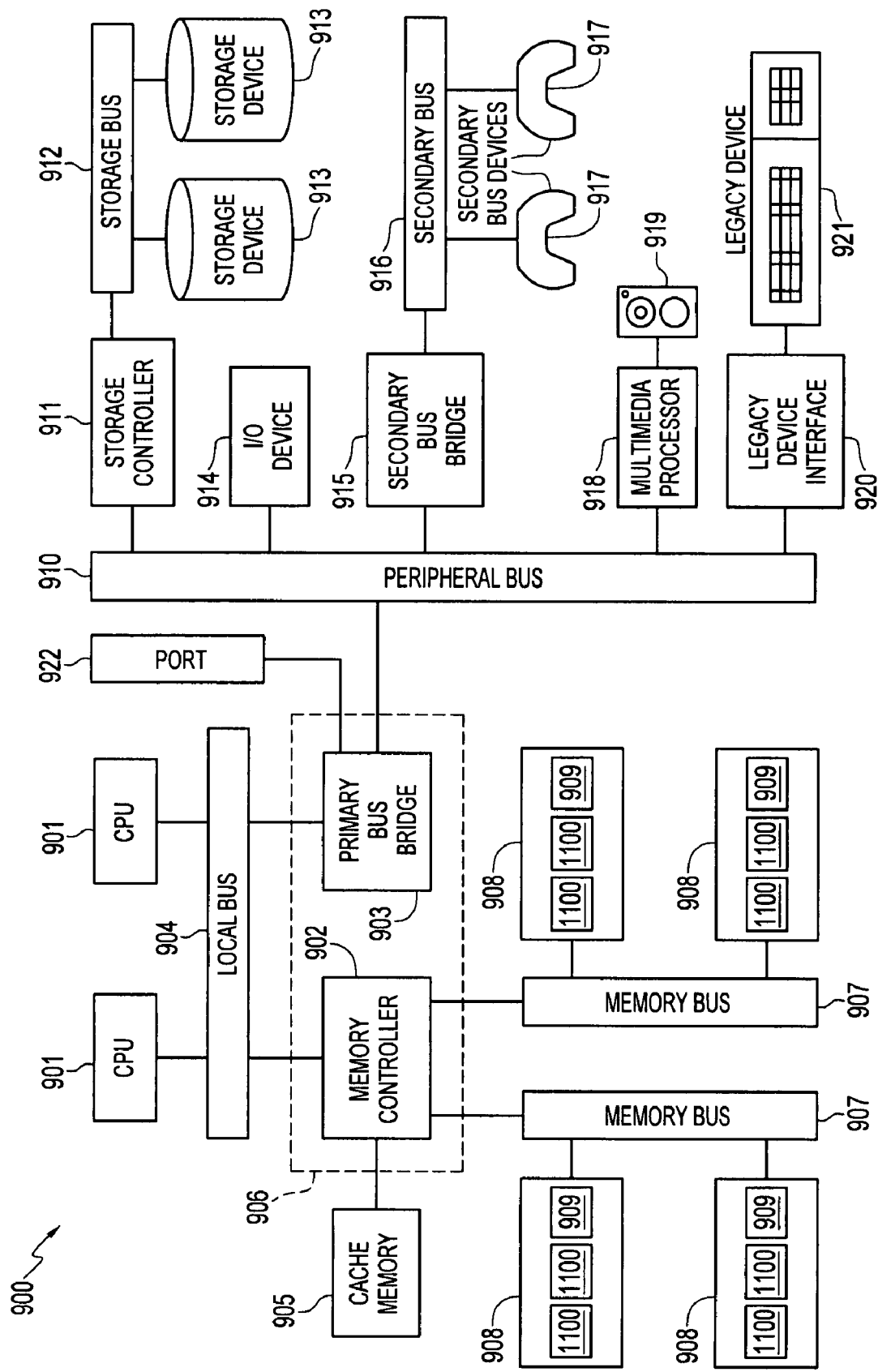
FIG. 13 illustrates a processing system containing embodiments described herein.

FIG. 13 illustrates a processing system 900 which utilizes a memory device 1100 containing an array of phase change memory cells 100 (FIG. 10) constructed as described above with reference to FIGS. 2-11. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908, which include at least one memory device 1100. Alternatively, in a simplified system, the memory controller 902 may be omitted and the memory components directly coupled to one or more processors 901. The memory components 908 may be a memory card or a memory module. The memory components 908 may include one or more additional devices 909. For example, the additional device 909 might be a configuration memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, a legacy device interface 920, a floppy disk drive, and a compact disc ROM drive. The primary bus bridge 903 may also be coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card or removable media devices. The secondary bus bridge may be used to interface additional devices via another bus to the processing system. For example, the secondary bus bridge may be a universal serial bus (USB) controller used to couple USB devices 917 to the processing system 900. The multimedia processor 918 may be a sound card, a video capture card, or any other type of media interface, which may also be coupled to additional devices such as speakers 919. The legacy device interface 920 is used to couple legacy devices 921, for example, older styled keyboards and mice, to the processing system 900.

While FIG. 13 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 1100. These electronic devices may include, but are not limited to audio/video processors and recorders, gaming consoles, digital television sets, wired or wireless telephones, navigation devices (including systems based on a global positioning system (GPS) and/or inertial navigation), and digital cameras and/or recorders. The modifications may include, for example, elimination of unnecessary components, addition of specialized devices or circuits, and/or integration of a plurality of devices.

It should also be appreciated that various embodiments have been described as using a phase change material as an exemplary variable resistance material. The invention may also be used in non-volatile memory devices using other types of variable resistance materials to fabricate structures where current densities and electric field may be uniformly distributed resulting in subsequent uniform signal integrity.

While various embodiments have been described above, it should be understood that they have been presented by way of example, and not limitation. It will be apparent to persons skilled in the relevant art that various changes in form and detail can be made.

What is claimed as new and desired to be protected by Letters Patent of the United States is:

1. A method of fabricating a phase change memory cell, comprising the steps of:
    forming a via in a first insulating material;
    etching a top portion of the via to form a substantially hemispherical-shaped portion;
    forming a first conductive material in the via, the first conductive material having substantially uniform thickness along sidewalls of the top portion, substantially filling a bottom portion of the via; and
    forming a phase change material in contact with the first conductive material and within the hemispherical-shaped portion of the via.

2. The method of claim 1, further comprising:
    providing a second insulating material formed over the first insulating material, the first conductive material, and the phase change material;
    forming a via in the second insulating material; and
    forming a second conductive material over the second insulating material.

3. The method of claim 2, wherein the step of forming a via in the second insulating material further comprises:
    patterning a masking material with an opening over the second insulating material; and
    etching to remove unmasked portions of the second insulating material to form the via.

4. The method of claim 2, wherein the first and second insulating materials are formed by deposition methods including sputtering, chemical vapor deposition, plasma enhanced chemical vapor deposition, and physical vapor deposition.

5. The method of claim 1, wherein the step of forming a via on the first insulating material further comprises:
    patterning a masking material with an opening over the first insulating material; and
    etching to remove unmasked portions of the first insulating material to form the via.

6. The method of claim 1, further comprising planarizing the first conductive material prior to formation of the phase change material using chemical mechanical planarization.

7. The method of claim 1, further comprising planarizing the phase change material subsequent to planarizing the first conductive material.

8. A method of fabricating a phase change memory cell, comprising the steps of:
    forming a first insulating material;
    patterning a masking material with an opening over the first insulating material;
    etching to remove unmasked portions of the first insulating material to form a first via in the first insulating material;
    etching a top portion of the first via to form a substantially hemispherical-shaped portion;
    forming a first conductive material in the first via, the first conductive material having substantially uniform thickness along sidewalls of the top portion, substantially filling a bottom portion of the first via and not completely filling the hemispherical-shaped portion of the via;
    planarizing a top surface of the first conductive material to be co-planar with a top surface of the first insulating material;
    forming a phase change material over the first conductive material and within the hemispherical-shaped portion of the via;
    planarizing the phase change material to the top surface of the first insulating material;
    forming a second insulating material over the first insulating material, the first conductive material, and the phase change material;
    patterning a masking material with an opening over the second insulating material;
    etching to remove unmasked portions of the second insulating material to form a second via; and
    forming a second conductive material over the second insulating material, the second conductive material substantially filling the second via.

* * * * *